United States Patent
Zhu (10) Patent No.: US 12,302,534 B1
(45) Date of Patent: May 13, 2025

(54) WIRELESS CHARGING POWER BANK

(71) Applicant: Guangdong Aoyun Technology Co., Ltd., Guangdong (CN)

(72) Inventor: Xueping Zhu, Guangdong (CN)

(73) Assignee: Guangdong Aoyun Technology Co., Ltd., Guangdong (CN)

( * ) Notice: Subject to any disclaimer, the term of this patent is extended or adjusted under 35 U.S.C. 154(b) by 0 days.

(21) Appl. No.: 19/006,894

(22) Filed: Dec. 31, 2024

(30) Foreign Application Priority Data

Dec. 23, 2024 (CN) .......................... 202423187014.7

(51) Int. Cl.
*H02J 50/00* (2016.01)
*H05K 5/00* (2006.01)
*H05K 5/02* (2006.01)
*H05K 5/03* (2006.01)
*H05K 7/20* (2006.01)

(52) U.S. Cl.
CPC ........ *H05K 7/20436* (2013.01); *H02J 50/005* (2020.01); *H05K 5/0017* (2013.01); *H05K 5/0086* (2013.01); *H05K 5/0209* (2022.08); *H05K 5/03* (2013.01)

(58) Field of Classification Search
None
See application file for complete search history.

(56) References Cited

U.S. PATENT DOCUMENTS

| | | | |
|---|---|---|---|
| 11,317,544 B1* | 4/2022 | Zeng | H02K 1/20 |
| 11,476,706 B2* | 10/2022 | Pinkos | H02J 50/005 |
| 11,522,382 B1* | 12/2022 | Vahle | H02J 7/342 |
| 2019/0222061 A1* | 7/2019 | Koyanagi | H04M 1/0262 |
| 2020/0212726 A1* | 7/2020 | Hwang | H05K 7/209 |
| 2022/0302756 A1* | 9/2022 | Lee | H05K 1/028 |
| 2022/0302757 A1* | 9/2022 | Pei | H02J 50/005 |
| 2023/0180356 A1* | 6/2023 | Mollmann | H05B 1/0266 |
| | | | 219/622 |
| 2023/0411995 A1* | 12/2023 | Hsiao | H05K 7/20909 |

FOREIGN PATENT DOCUMENTS

| | | | | |
|---|---|---|---|---|
| CN | 114050631 A | * | 2/2022 | |
| WO | WO-2019124755 A1 | * | 6/2019 | H01F 27/2876 |
| WO | WO-2024077414 A1 | * | 4/2024 | |
| WO | WO-2024187320 A1 | * | 9/2024 | |

* cited by examiner

*Primary Examiner* — Xanthia C Relford (57) ABSTRACT

A wireless charging power bank includes a first shell, a second shell, a heat dissipation shell, a battery and a coil. The first shell is connected with the second shell to form an accommodating space, and the battery is arranged inside the accommodating space. The heat dissipation shell is connected with the first shell or the second shell, a part of the heat dissipation shell is arranged on the outermost side of the wireless charging power bank, and the coil is electrically connected with the battery for wirelessly charging an external device; and the coil abuts against the heat dissipation shell, and the heat dissipation shell is used for conducting heat generated by the coil to the outside.

20 Claims, 11 Drawing Sheets

WIRELESS CHARGING POWER BANK

CROSS-REFERENCE TO RELATED APPLICATIONS

The application claims priority of Chinese patent application CN202423187014.7, filed on Dec. 23, 2024, which is incorporated herein by reference in its entireties.

TECHNICAL FIELD

The present disclosure relates to the field of power banks, in particular to a wireless charging power bank.

BACKGROUND

The power bank is an essential thing for people in modern life. The power bank can charge mobile phones, tablets, headphones and other devices. However, when the devices are charged by the power bank, people have to face the trouble of messy data cables caused by different interfaces, and this problem is solved by the power bank with a wireless charging function. However, the wireless charging power bank will generate a lot of heat when charging devices. If the heat is not dissipated in time, the charging power of the power bank will be reduced, the user will be scalded, and even the risk of fire will be caused. Therefore, the present disclosure provides a wireless charging power bank, which can effectively solve the above problems.

SUMMARY

In order to overcome the shortcomings of the prior art, the technical solution adopted by the present invention to solve the technical problem is as follows.

A wireless charging power bank includes a first shell, a second shell, a heat dissipation shell, a battery and a coil. The first shell is connected with the second shell to form an accommodating space, and the battery is arranged inside the accommodating space. The heat dissipation shell is connected with the first shell or the second shell, a part of the heat dissipation shell is arranged on the outermost side of the wireless charging power bank, and the coil is electrically connected with the battery for wirelessly charging an external device; and the coil abuts against the heat dissipation shell, and the heat dissipation shell is used for conducting heat generated by the coil to the outside.

Furthermore, the first shell is detachably connected with the second shell.

Furthermore, the first shell is detachably covered with the heat dissipation shell.

Furthermore, the outer side of the heat dissipation shell is provided with a circular first boss for bearing the coil, a first shaft hole is formed in the middle of the first boss, a second shaft hole is formed in the middle of the coil, the coil is configured on the first boss, and the first shaft hole corresponds to the second shaft hole in position.

Furthermore, the wireless charging power bank also includes an annular magnet, and the annular magnet is used for adsorbing the external device; and a second annular groove is formed in the heat dissipation shell around the first boss, and the magnet is configured inside the second annular groove.

Furthermore, the inner side of the heat dissipation shell, at the position corresponding to the second annular groove, is provided with an annular boss; and a first annular groove matched with the size of the annular boss is formed in the outer side of the first shell, and when the heat dissipation shell is installed on the first shell, the annular boss is clamped into the first annular groove.

Furthermore, a hollow first convex shaft is arranged at the position of the center point of the first annular groove, and the first shaft hole of the heat dissipation shell and the second shaft hole of the coil sleeve the first convex shaft.

Furthermore, the wireless charging power bank also includes a cover plate matched with the size of the second annular groove, the middle of the inner side of the cover plate is provided with a second convex shaft, one side of the second convex shaft is provided with a protruding first fixture block, the second convex shaft passes through the first shaft hole and the second shaft hole and is inserted into the hollow first convex shaft, and the first fixture block is clamped into an inside wall of the first shell, so that the coil is covered with the cover plate and the cover plate is installed inside the second annular groove.

Furthermore, an inside edge of the cover plate is provided with a plurality of first connectors, and one side of the first connector is provided with a second fixture block; a second connecting hole is formed in the second annular groove, a first connecting hole corresponding to the second connecting hole in position is formed in the first annular groove, the first connector is inserted in the second connecting hole and the first connecting hole, and the second fixture block is clamped into the inside wall of the first shell.

Furthermore, the magnet is provided with an extension end, and the extension end is provided with a convex block; and a first through hole is formed in the first annular groove, a second through hole is formed in the second annular groove and at the corresponding position of the first through hole, a neck matched with the convex block is formed in the inner side of the first shell, and after the extension end passes through the second through hole and the first through hole, the convex block is clamped into the neck so that the magnet is installed in the second annular groove.

Furthermore, the wireless charging power bank also includes a control circuit board, and the control circuit board is arranged inside the accommodating space and electrically connected with the battery.

Furthermore, a first conductor hole is formed in the first annular groove, a second conductor hole is formed in the second annular groove and at the corresponding position of the first conductor hole, and the coil is electrically connected with the control circuit board through the first conductor hole and the second conductor hole.

Furthermore, the control circuit board is provided with an indicator light; and a notch is formed in the position, corresponding to the indicator light, of the second shell.

Furthermore, the control circuit board is also provided with a power interface.

Furthermore, the second shell is provided with a power button, and the power button is electrically connected with the control circuit board.

Furthermore, the inner side of the second shell is provided with a second connector, and one end of the second connector is provided with a third fixture block; a first slot is formed in the first shell, and a third connecting hole is formed in the first slot; the second connector is inserted in the first slot, and the third fixture block is clamped into the third connecting hole so that the first shell is connected with the second shell; and the third fixture block gets away from the third connecting hole so that the second connector is detached from the first slot.

Furthermore, the heat dissipation shell is provided with a third connector, and a fourth connecting hole is formed in the third connector; a second slot is formed in the first shell, the second slot is internally provided with a fourth fixture block, the third connector is inserted in the second slot, and the fourth fixture block is clamped into the fourth connecting hole so that the heat dissipation shell is connected with the first shell; and the fourth fixture block gets away from the fourth connecting hole so that the third connector is detached from the second slot.

Furthermore, a plurality of heat sinks are formed in the surface of the heat dissipation shell.

Furthermore, the wireless charging power bank also includes heat insulation boards, and the heat insulation boards are arranged on both sides of the battery; and the heat insulation board is made of aerogel.

Furthermore, the surface of the cover plate is provided with a plurality of strip bulges.

Beneficial effects: The metal heat dissipation shell is installed on the wireless charging power bank in the present disclosure. When the wireless charging power bank is used by a user, the heat generated by the coil and the battery can be conducted out in time to prevent the problems of power decrease, user scalding, spontaneous combustion and the like caused by excessively high temperature of the wireless charging power bank. The heat dissipation shell provides a good heat dissipation performance for the wireless charging power bank, so that a better use experience is provided for the user, and the safety of the wireless charging power bank is improved.

BRIEF DESCRIPTION OF THE DRAWINGS

In order to explain the technical solutions of the embodiments of the present invention more clearly, the following will briefly introduce the accompanying drawings used in the embodiments. Apparently, the drawings in the following description are only some embodiments of the present invention. Those of ordinary skill in the art can obtain other drawings based on these drawings without creative work.

The present invention is further described below in detail in combination with the accompanying drawings and embodiments.

DETAILED DESCRIPTION OF THE EMBODIMENTS

The technical solutions in the embodiments of the present invention will be clearly and completely described below in conjunction with the accompanying drawings in the embodiments of the present invention. Apparently, the described embodiments are only a part of the embodiments of the present invention, rather than all the embodiments. Based on the embodiments in the present invention, all other embodiments obtained by those ordinarily skilled in the art without doing creative work shall fall within the protection scope of the present invention.

Figure 1:
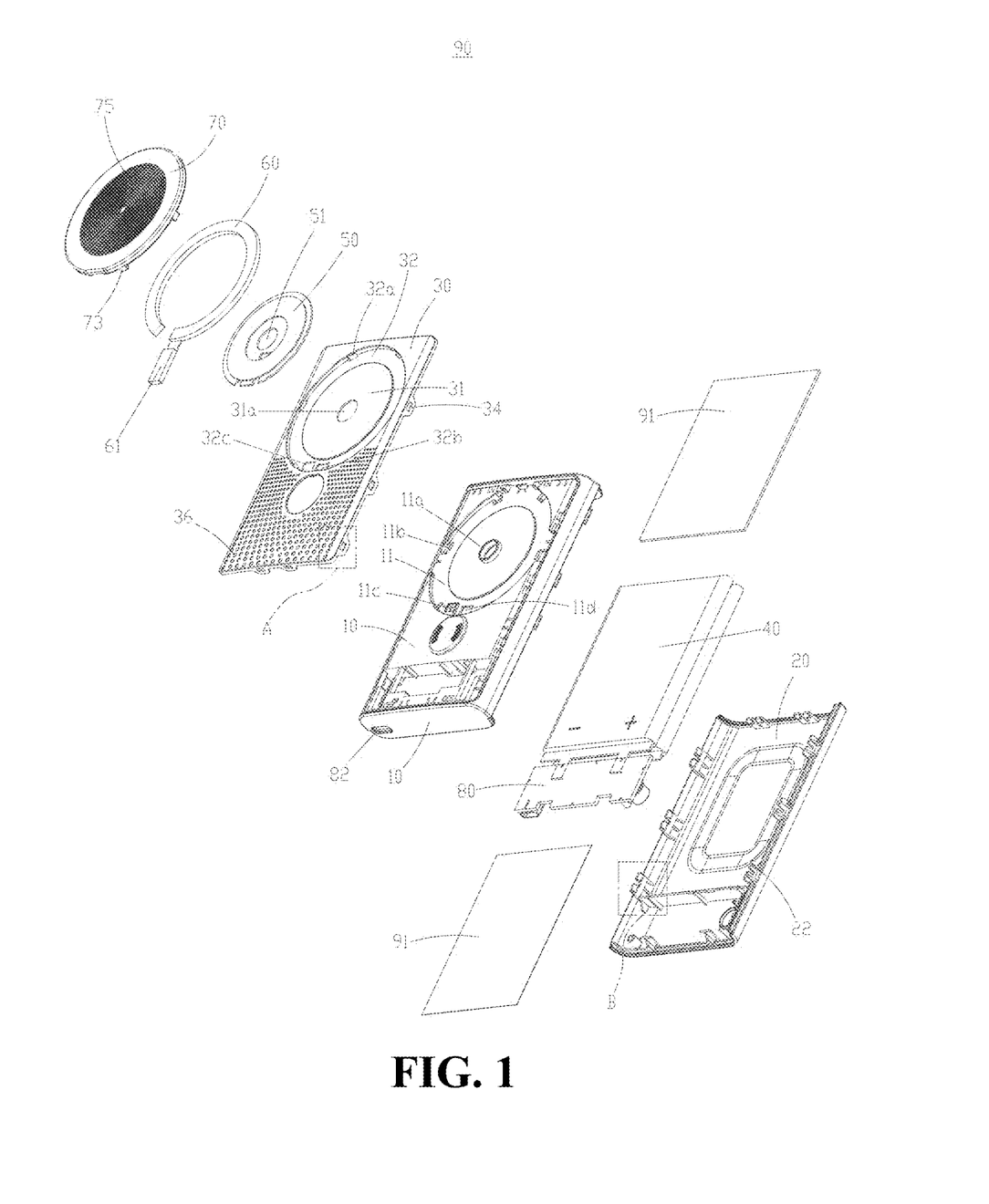
FIG. 1 is a breakdown schematic diagram in the present disclosure, and a stereochemical structural schematic diagram in an embodiment.
Figure 2:
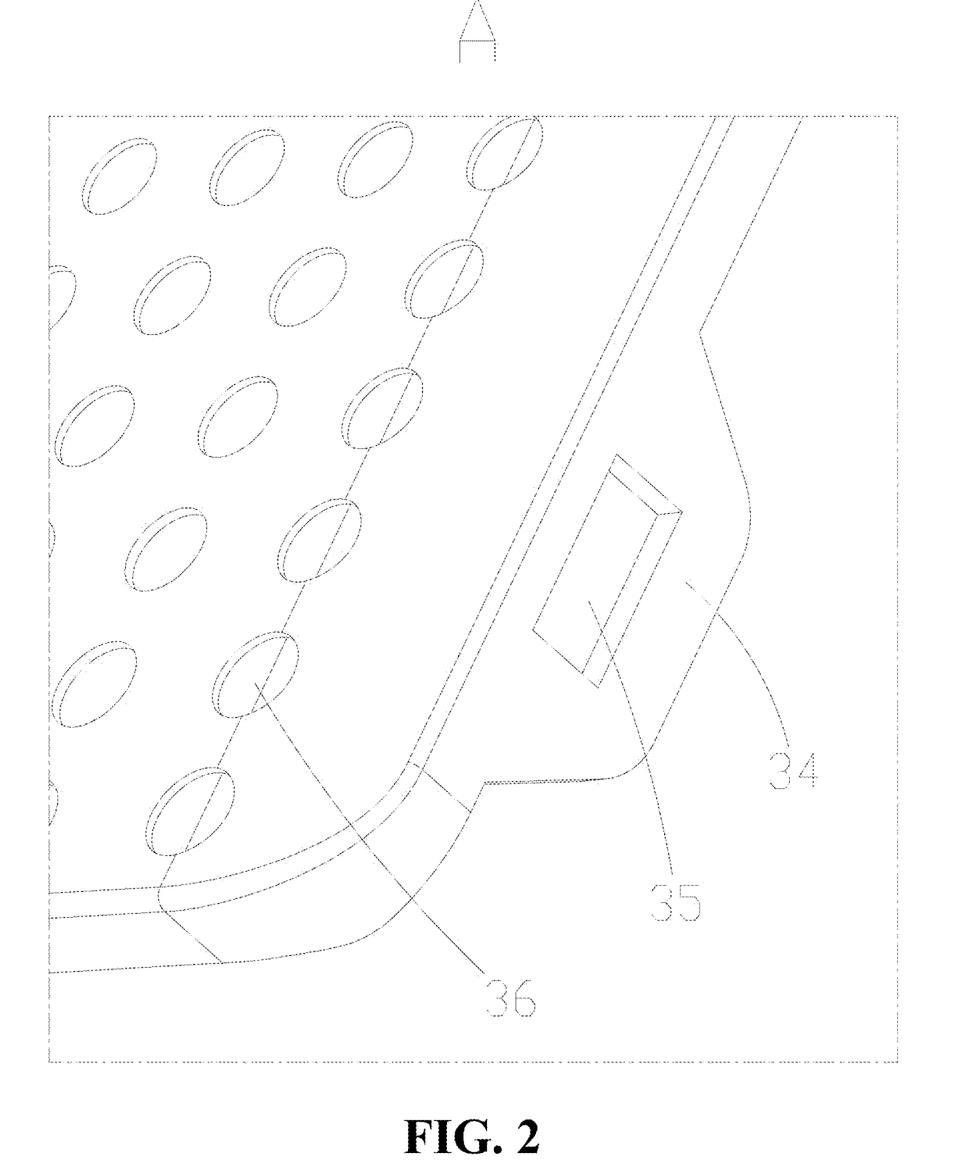
FIG. 2 is an enlarged drawing of part A in FIG. 1.
Figure 3:
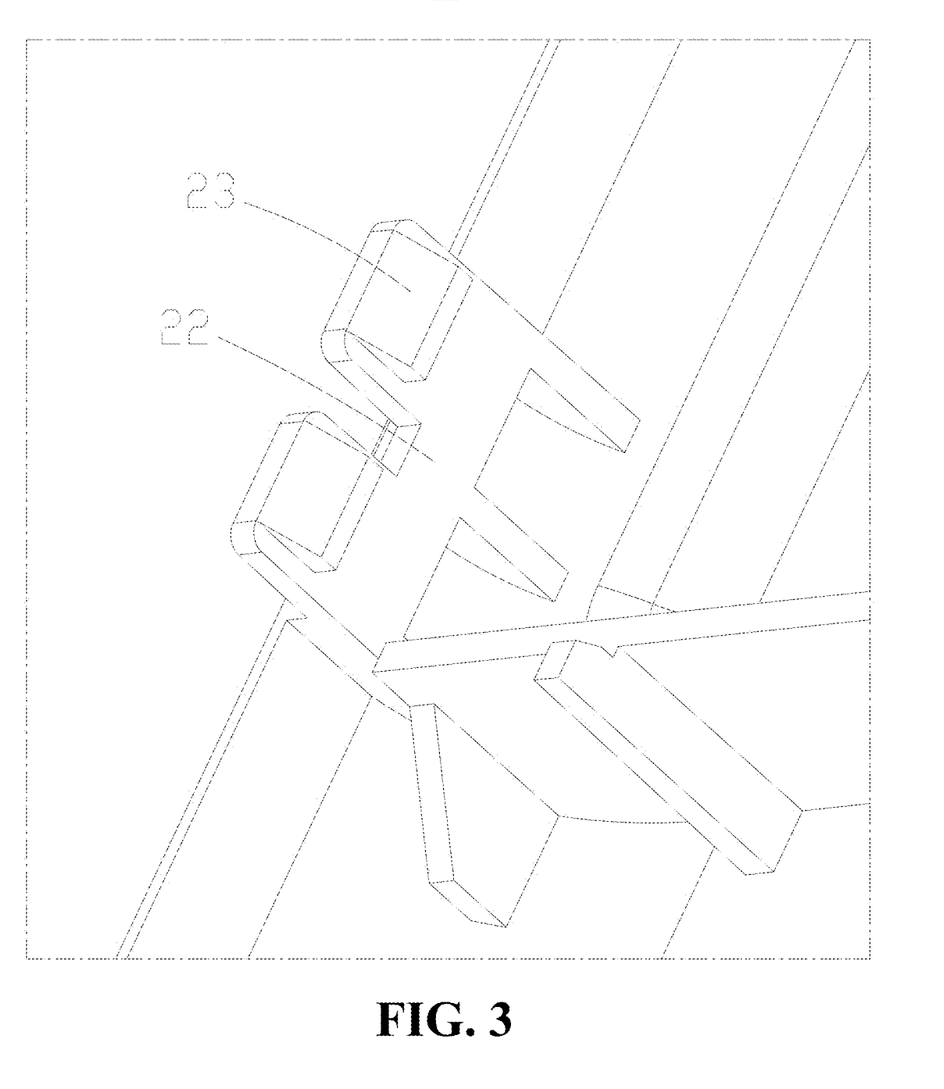
FIG. 3 is an enlarged drawing of part B in FIG. 1.
Figure 4:
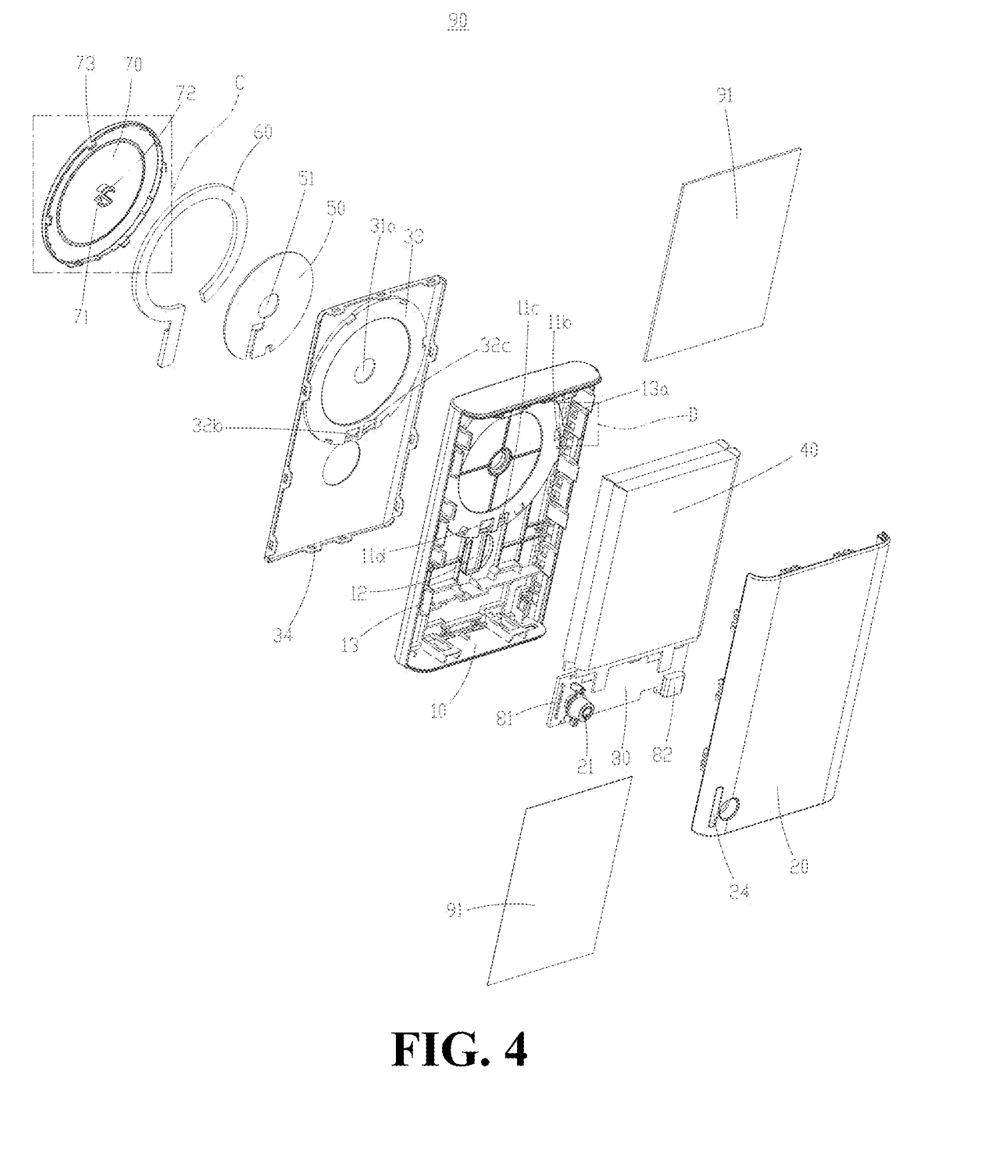
FIG. 4 is a breakdown schematic diagram at another angle in the present disclosure.
Figure 5:
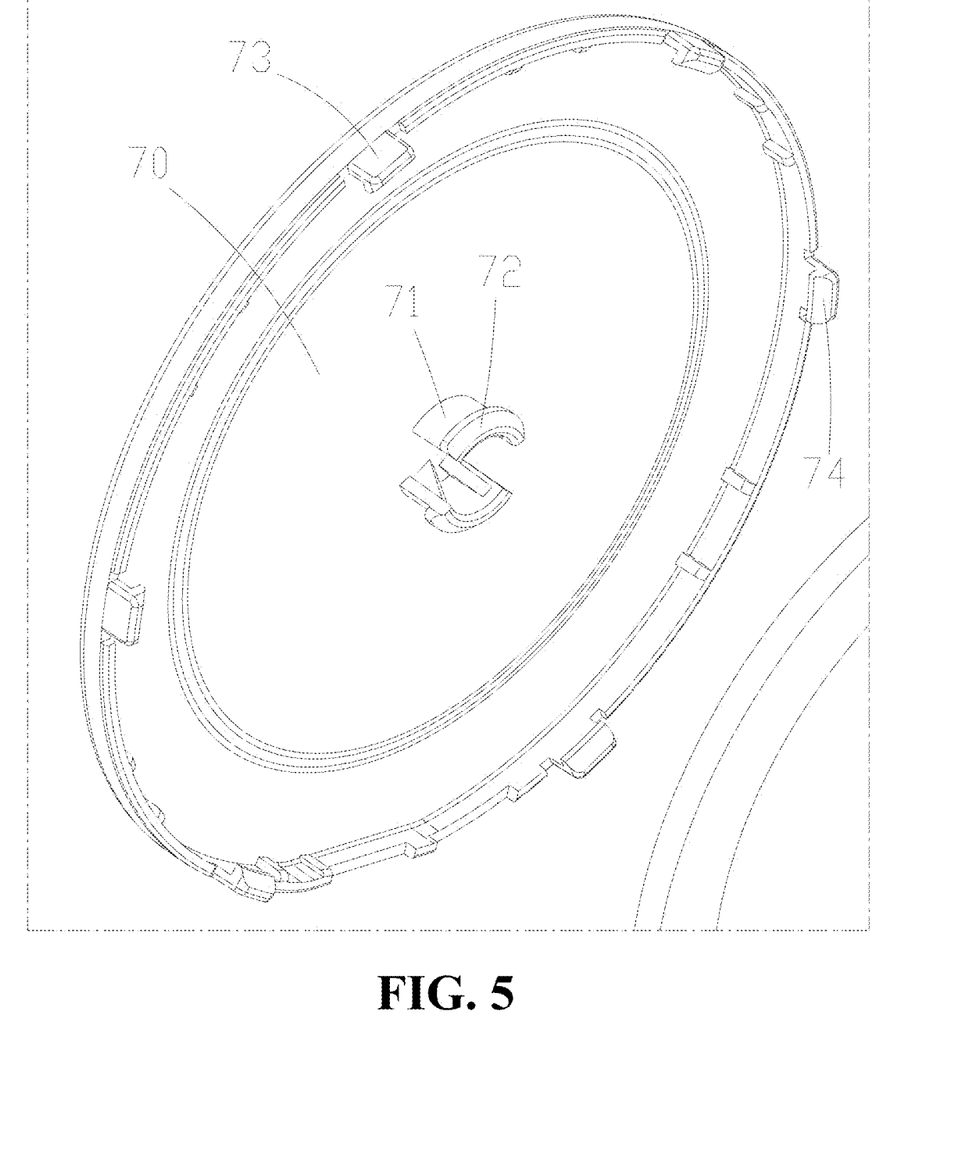
FIG. 5 is an enlarged drawing of part C in FIG. 4.
Figure 6:
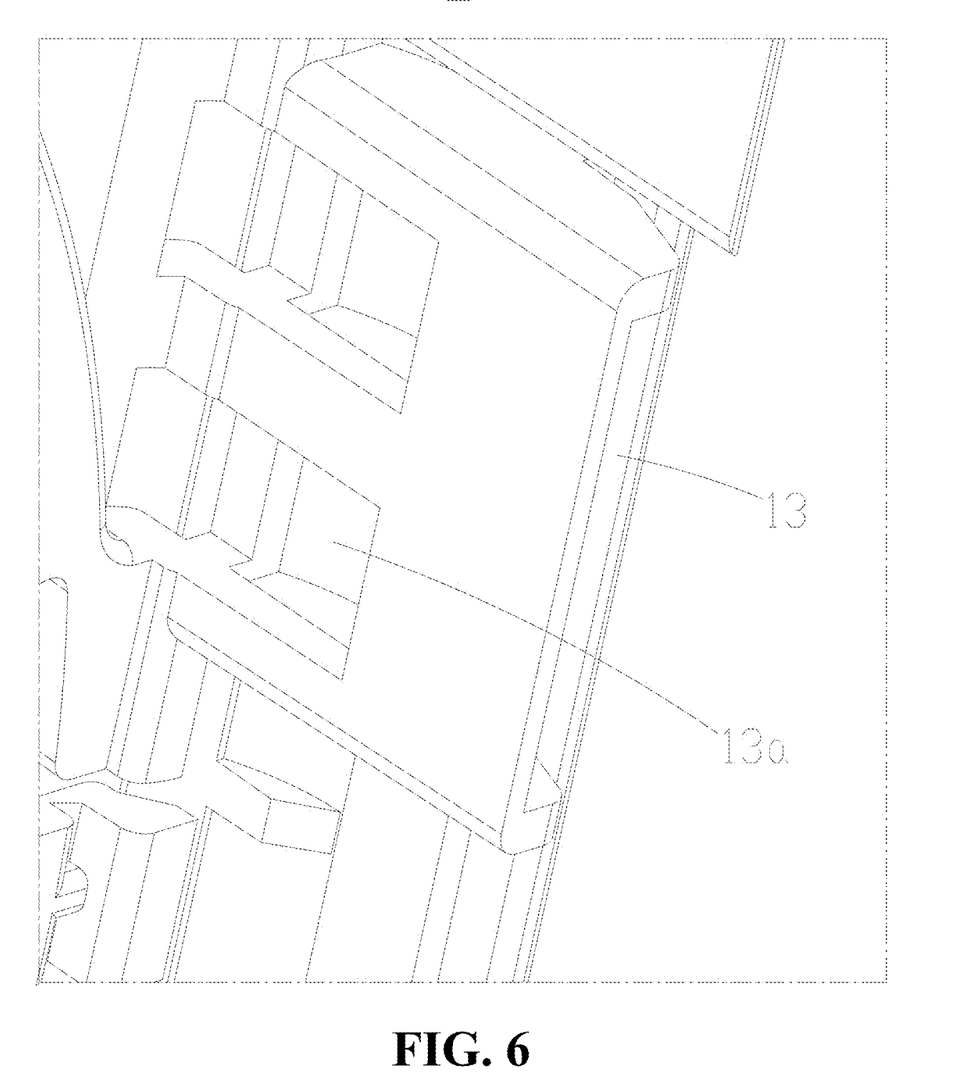
FIG. 6 is an enlarged drawing of part D in FIG. 4.
Figure 7:
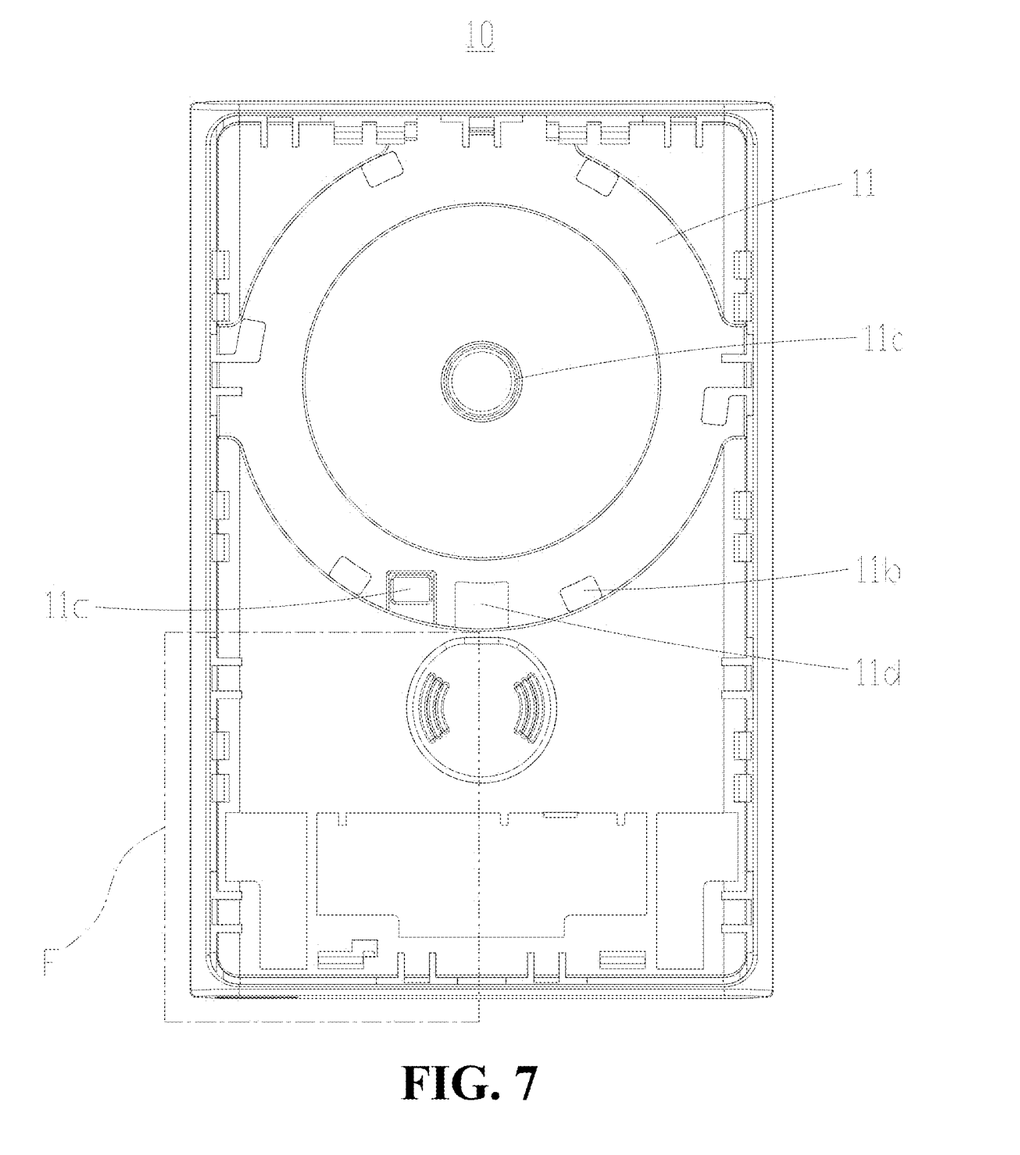
FIG. 7 is a stereochemical structural schematic diagram of a first shell in the present disclosure.
Figure 8:
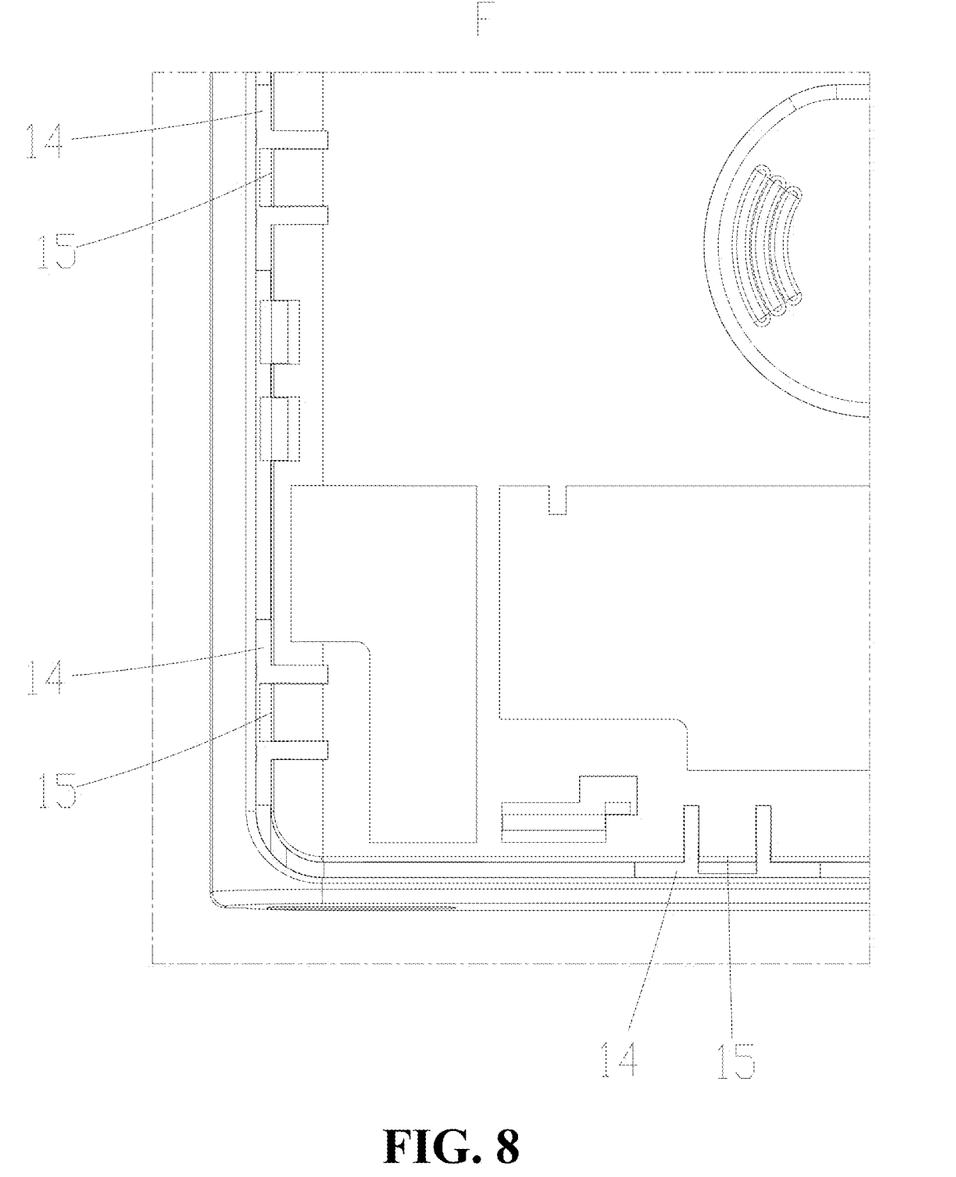
FIG. 8 is an enlarged drawing of part F in FIG. 7.
Figure 9:
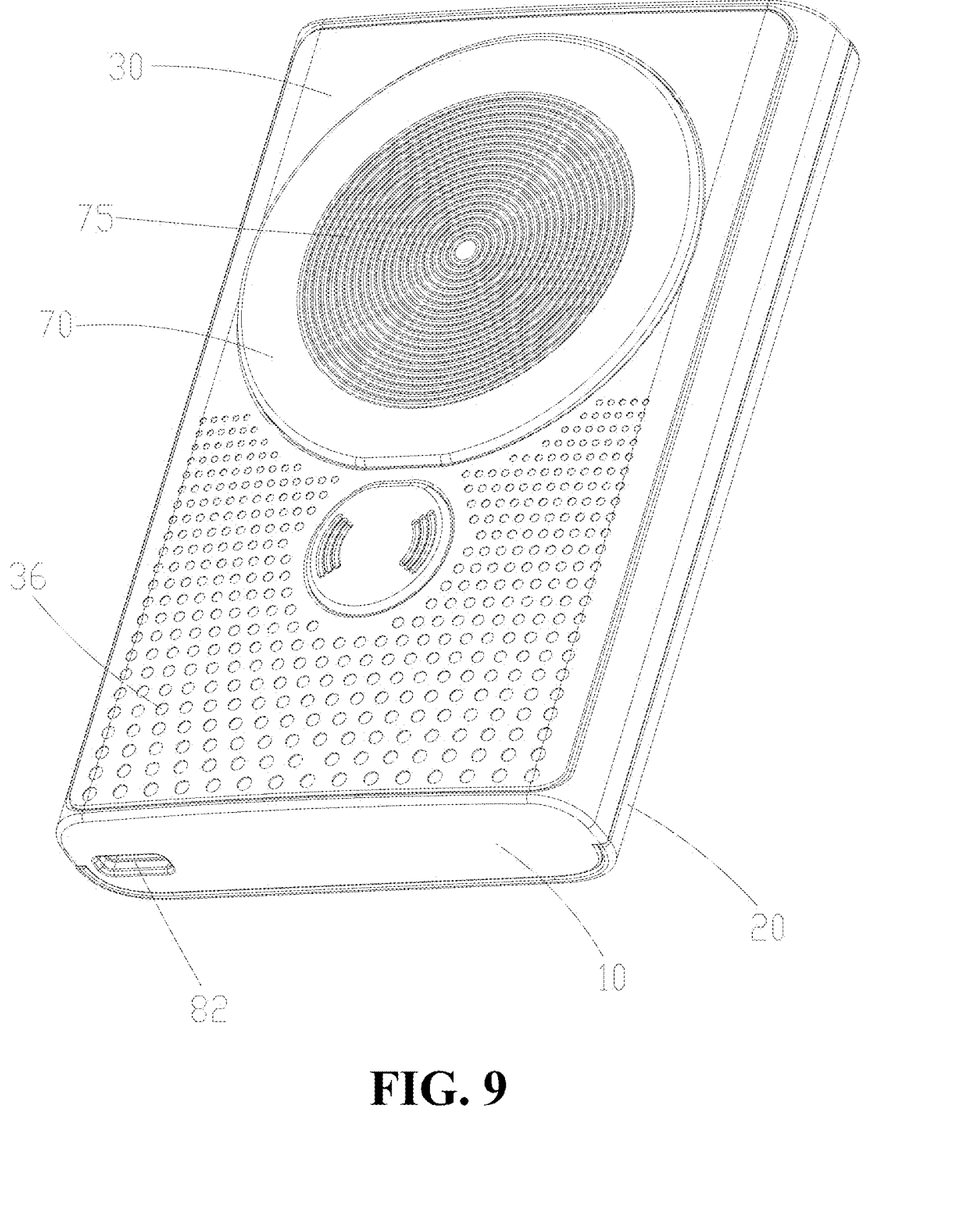
FIG. 9 is a stereoscopic structural schematic diagram of the present disclosure.
Figure 10:
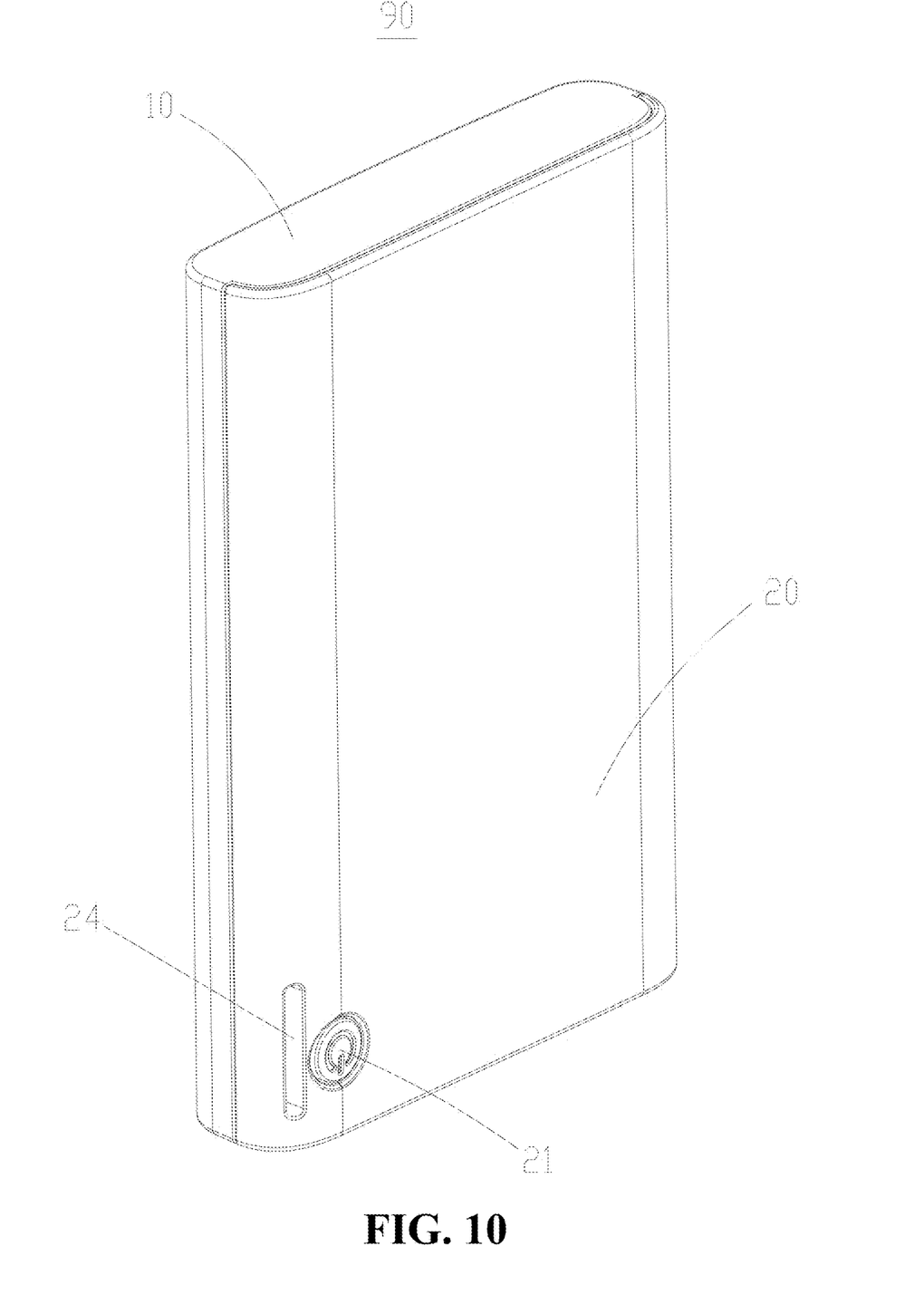
FIG. 10 is a stereoscopic structural schematic diagram at another angle in the present disclosure.
Figure 11:
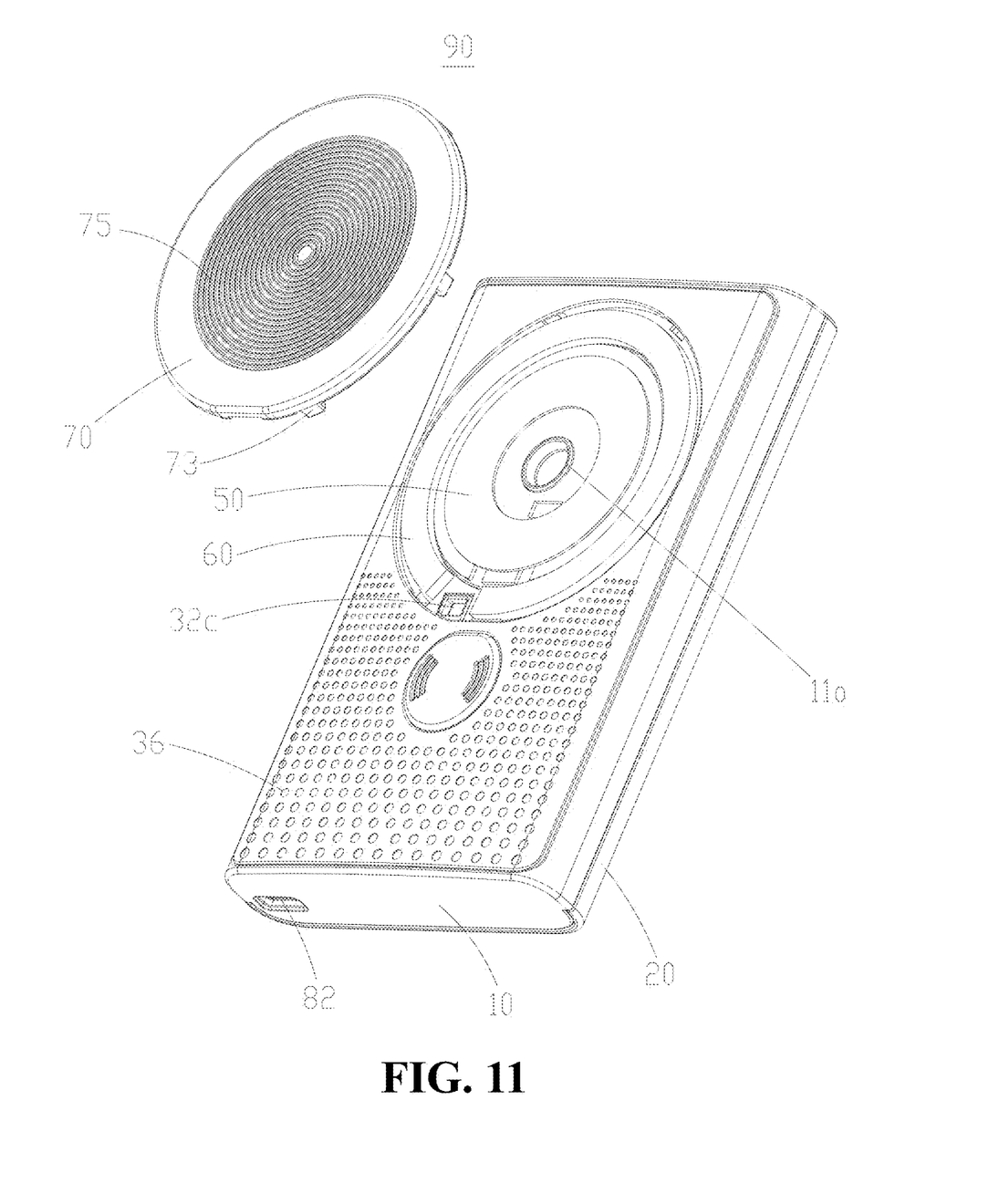
FIG. 11 is a breakdown schematic diagram at another angle in the present disclosure.

Referring to FIG. 1 to FIG. 11, the present disclosure provides a wireless charging power bank 90, including a first shell 10, a second shell 20, a heat dissipation shell 30, a battery 40 and a coil 50. The first shell 10 is connected with the second shell 20 to form an accommodating space, and the battery 40 is arranged inside the accommodating space. The heat dissipation shell 30 is connected with the first shell 10 or the second shell 20, a part of the heat dissipation shell 30 is arranged on the outermost side of the wireless charging power bank 90, and the coil 50 is electrically connected with the battery 40 for wirelessly charging an external device. The coil 50 abuts against the heat dissipation shell 30, and the heat dissipation shell 30 is used for conducting heat generated by the coil 50 and the battery 40 to the outside.

The metal heat dissipation shell is installed on the wireless charging power bank in the present disclosure. When the wireless charging power bank is used by a user, the heat generated by the coil and the battery can be conducted out in time to prevent the problems of power decrease, user scalding, spontaneous combustion and the like caused by excessively high temperature of the wireless charging power bank. The heat dissipation shell provides a good heat dissipation performance for the wireless charging power bank, so that a better use experience is provided for the user, and the safety of the wireless charging power bank is improved.

It can be understood that the battery is arranged inside the wireless charging power bank to abut against the first shell and the second shell. The heat dissipation shell is connected with the first shell or the second shell, and a part of the heat dissipation shell is connected with the coil. When the wireless charging power bank is in operation, the heat generated by the coil and the battery will be conducted to the heat dissipation shell, and then the cooing shell conducts the heat to the external environment. The heat dissipation shell may be made of heat dissipation materials such as aluminum, iron and silver.

Further, the first shell 10 is detachably connected with the second shell 20.

It can be understood that the first shell is detachably connected with the second shell without traditional fasteners such as bolts and rivets, so that quick assembly and quick disassembly are facilitated, the production and assembly links are simplified, and the efficiency is improved.

Further, the first shell 10 is detachably covered with the heat dissipation shell 30.

It can be understood that the heat dissipation shell is detachably connected with the first shell without traditional fasteners such as bolts and rivets, so that quick assembly and quick disassembly are facilitated, the production and assembly links are simplified, and the efficiency is improved.

Further, the outer side of the heat dissipation shell 30 is provided with a circular first boss 31 for bearing the coil 50, a first shaft hole 31a is formed in the middle of the first boss 31, a second shaft hole 51 is formed in the middle of the coil 50, the coil 50 is configured on the first boss 31, and the first shaft hole 31a corresponds to the second shaft hole 51 in position.

It can be understood that the coil is arranged on the first boss so that the coil is connected with the heat dissipation shell, so that the heat generated when the coil is in operation is conducted to the heat dissipation shell. The second shaft hole is formed in the center of the coil and the first shaft hole is formed in the center of the first boss, so that the coil and the heat dissipation shell are facilitated to be fixed on the shaft body. The installation is convenient, and the design is simple and practical.

Further, the wireless charging power bank 90 also includes an annular magnet 60, and the annular magnet 60 is used for adsorbing the external device. A second annular groove 32 is formed in the heat dissipation shell 30 around the first boss 31, and the magnet 60 is configured inside the second annular groove 32.

It can be understood that the wireless charging power bank is provided with a magnet, which can enable the wireless charging power bank to have a magnetic attraction function and attract the external charging device, so that richer use experience is provided for the user.

Further, the inner side of the heat dissipation shell 30, at the position corresponding to the second annular groove 32, is provided with an annular boss 33. A first annular groove 11 matched with the size of the annular boss 33 is formed in the outer side of the first shell 10, and when the heat dissipation shell 30 is installed on the first shell 10, the annular boss 33 is clamped into the first annular groove 11.

It can be understood that the shape and size of the annular boss are matched the size of the first annular groove, and when the heat dissipation shell is installed on the first shell, the annular boss can be clamped into the first annular groove, so that the stability of fixation between the heat dissipation shell and the first shell is strengthened.

Further, a hollow first convex shaft 11a is arranged at the position of the center point of the first annular groove 11, and the first shaft hole 31a of the heat dissipation shell 30 and the second shaft hole 51 of the coil 50 sleeve the first convex shaft 11a.

It can be understood that the second shaft hole of the coil sleeves the first convex shaft, and the first shaft hole of the heat dissipation shell sleeves the first convex shaft, so that the coil and the heat dissipation shell can be fixed, and the design is simple and practical.

Further, the wireless charging power bank 90 also includes a cover plate 70 matched with the size of the second annular groove 32, the middle of the inner side of the cover plate 70 is provided with a second convex shaft 71, one side of the second convex shaft 71 is provided with a protruding first fixture block 72, the second convex shaft 71 passes through the first shaft hole 31a and the second shaft hole 51 and is inserted into the hollow first convex shaft 11a, and the first fixture block 72 is clamped into an inside wall of the first shell 10, so that the coil 50 is covered with the cover plate 70 and the cover plate 70 is installed inside the second annular groove 32.

It can be understood that the second convex shaft in the center of the cover plate can be inserted into the hollow first convex shaft, and the first fixture block arranged on the second convex shaft can be clamped into the inside wall of the first shell to connect the cover plate to the first shell. The second convex shaft is of elasticity, which is convenient for the user to install and detach the cover plate.

Further, an inside edge of the cover plate 70 is provided with a plurality of first connectors 73, and one side of the first connector 73 is provided with a second fixture block 74. A second connecting hole 32a is formed in the second annular groove 32, a first connecting hole 11b corresponding to the second connecting hole 32a in position is formed in the first annular groove 11, the first connector 73 is inserted in the second connecting hole 32a and the first connecting hole 11b, and the second fixture block 74 is clamped into the inside wall of the first shell 10.

It can be understood that the positions of the plurality of first connectors correspond to those of the plurality of second connecting holes one to one, and after the first connector is inserted into the second connecting hole, the second fixture block on the first connector can be clamped into the inside wall of the first shell to further fix the cover plate. The first connector is of elasticity, which is convenient for rapid disassembly and installation of the cover plate.

Further, the magnet 60 is provided with an extension end, and the extension end is provided with a convex block 61. A first through hole 11d is formed in the first annular groove 11, a second through hole 32b is formed in the second annular groove 32 and at the corresponding position of the first through hole 11d, a neck 12 matched with the convex block 61 is formed in the inner side of the first shell 10, and after the extension end passes through the second through hole 32b and the first through hole 11d, the convex block 61 is clamped into the neck 12 so that the magnet 60 is installed in the second annular groove 32.

It can be understood that after the extension end of the magnet passes through the first through hole and the second through hole, the convex block on the extension end can be clamped into the neck inside the first shell, so that the magnet is fixed in the second annular groove, the design is simple and practical, and quick assembly and quick disassembly are facilitated.

Further, the wireless charging power bank 90 also includes a control circuit board 80, and the control circuit board 80 is arranged inside the accommodating space and electrically connected with the battery 40.

It can be understood that the control circuit board can control the power-on and power-off of the wireless charging power bank, and the current can also be converted into alternating current and conducted to the coil, so that the coil generates a magnetic field.

Further, a first conductor hole 11c is formed in the first annular groove 11, a second conductor hole 32c is formed in the second annular groove 32 and at the corresponding position of the first conductor hole 11c, and the coil 50 is electrically connected with the control circuit board 80 through the first conductor hole 11c and the second conductor hole 32c.

It can be understood that one end of the coil is connected with the control circuit board after passing through the first conductor hole and the second conductor hole, so that the space is reasonably utilized, and the design is simple and practical.

Further, the control circuit board 80 is provided with an indicator light 81; and a notch 24 is formed in the position, corresponding to the indicator light 81, of the second shell 20.

It can be understood that a plurality of indicator lights are arranged in sequence. The more the remaining battery power is, the more the number of the lit indicator lights is. The less the remaining battery power is, the less the number of the lit indicator lights is.

In some embodiments, the number of the indicator lights may be one, and the color of the indicator light may change depending on the amount of battery power.

The user can see the indicator light through the slot to know how much battery power remains, so that the user experience is improved.

Further, the control circuit board 80 is also provided with a power interface 82.

It can be understood that the user can connect a power cord to the power interface to charge the wireless charging power bank, and the power interface can be, but is not limited to, a commonly used interface such as USB and Type-C.

Further, the second shell 20 is provided with a power button 21, and the power button 21 is electrically connected with the control circuit board 80.

It can be understood that the user can control the wireless charging power bank to start charging or stop charging by pressing the power button, which is convenient for the user to use. Further, the inner side of the second shell 20 is provided with a second connector 22, and one end of the second connector 22 is provided with a third fixture block 23. A first slot 13 is formed in the first shell 10, and a third connecting hole 13a is formed in the first slot 13. The second connector 22 is inserted in the first slot 13, and the third fixture block 23 is clamped into the third connecting hole 13a so that the first shell 10 is connected with the second shell 20. The third fixture block 23 gets away from the third connecting hole 13a so that the second connector 22 is detached from the first slot 13.

It can be understood that a plurality of second connector are provided, and a plurality of first slots are provided, the positions of the plurality of second connectors correspond to those of the plurality of first slots one to one. After the second connector is inserted into the first slot, the third fixture block arranged on the second connector is clamped into the third connecting hole in the first slot, so that the first shell is locked on the second shell. The second connector is of elasticity, and after the third fixture block is moved out of the third connecting hole, the second connector is pulled out from the first slot to detach the first shell from the second shell.

Further, the heat dissipation shell 30 is provided with a third connector 34, and a fourth connecting hole 35 is formed in the third connector 34. A second slot 14 is formed in the first shell 10, the second slot 14 is internally provided with a fourth fixture block 15, the third connector 34 is inserted in the second slot 14, and the fourth fixture block 15 is clamped into the fourth connecting hole 35 so that the heat dissipation shell 30 is connected with the first shell 10. The fourth fixture block 15 gets away from the fourth connecting hole 35 so that the third connector 34 is detached from the second slot 14.

It can be understood that a plurality of third connectors are provided, a plurality of second slots are provided, and the positions of the plurality of third connectors correspond to those of the plurality of second slots one to one. After the third connector is inserted into the second slot, the fourth fixture block in the second slot is clamped into the fourth connecting hole in the third connector, so that the heat dissipation shell is locked on the first shell. The fourth fixture block is removed from the fourth connecting hole, and the third connector is removed from the second slot, so that the heat dissipation shell is detached from the first shell.

Further, a plurality of heat sinks 36 are formed in the surface of the heat dissipation shell 30.

It can be understood that the heat sinks can increase the heat dissipation area of the heat dissipation shell, so that the heat dissipation performance of the heat dissipation shell is further improved. At the same time, when the external device is charged on the wireless charging power bank, the heat sinks can reduce the contact area between the heat dissipation shell and the external device, so that the heat accumulation is little, and the heat dissipation performance is improved.

Further, the wireless charging power bank 90 also includes heat insulation boards 91, and the heat insulation boards are arranged on both sides of the battery 40. The heat insulation board 91 may be made of aerogel.

It can be understood that the number of heat insulation boards is two. When the wireless charging power bank is in operation, the battery will generate heat. The heat insulation boards are attached to both sides of the battery and the main surface of the battery is covered with the heat insulation boards, which can effectively block the heat generated by the battery from being conducted to the external shell to provide a better experience for the user. At the same time, the heat insulation board can also play a buffering role, so that the battery can be provided.

Further, the surface of the cover plate 70 is provided with a plurality of strip bulges 75.

It is understood that the plurality of strip bulges on the surface of the cover plate can increase the surface area of the surface of the cover plate, so that the heat dissipation area is increased, and the heat dissipation performance is further enhanced.

As described above, one or more embodiments are provided in conjunction with the detailed description, The specific implementation of the present invention is not confirmed to be limited to that the description is similar to or similar to the method, the structure and the like of the present invention, or a plurality of technical deductions or substitutions are made on the premise of the conception of the present invention to be regarded as the protection of the present invention.

What is claimed is:

1. A wireless charging power bank, comprising a first shell, a second shell, a heat dissipation shell, a battery and a coil, wherein the first shell is connected with the second shell to form an accommodating space, and the battery is arranged inside the accommodating space; the heat dissipation shell is connected with the first shell or the second shell, a part of the heat dissipation shell is arranged on the outermost side of the wireless charging power bank, and the coil is electrically connected with the battery for wirelessly charging an external device; and the coil abuts against the heat dissipation shell, and the heat dissipation shell is used for conducting heat generated by the coil to the outside.

2. The wireless charging power bank according to claim 1, wherein the first shell is detachably connected with the second shell.

3. The wireless charging power bank according to claim 1, wherein the first shell is detachably covered with the heat dissipation shell.

4. The wireless charging power bank according to claim 1, wherein the outer side of the heat dissipation shell is provided with a circular first boss for bearing the coil, a first shaft hole is formed in the middle of the first boss, a second shaft hole is formed in the middle of the coil, the coil is configured on the first boss, and the first shaft hole corresponds to the second shaft hole in position.

5. The wireless charging power bank according to claim 4, wherein the wireless charging power bank also comprises an annular magnet, and the annular magnet is used for adsorbing the external device; and a second annular groove is formed in the heat dissipation shell around the first boss, and the magnet is configured inside the second annular groove.

6. The wireless charging power bank according to claim 5, wherein the inner side of the heat dissipation shell, at the position corresponding to the second annular groove, is provided with an annular boss; and a first annular groove matched with the size of the annular boss is formed in the outer side of the first shell, and when the heat dissipation shell is installed on the first shell, the annular boss is clamped into the first annular groove.

7. The wireless charging power bank according to claim 6, wherein a hollow first convex shaft is arranged at the position of the center point of the first annular groove, and the first shaft hole of the heat dissipation shell and the second shaft hole of the coil sleeve the first convex shaft.

8. The wireless charging power bank according to claim 7, wherein the wireless charging power bank also comprises a cover plate matched with the size of the second annular groove, the middle of the inner side of the cover plate is provided with a second convex shaft, one side of the second convex shaft is provided with a protruding first fixture block, the second convex shaft passes through the first shaft hole and the second shaft hole and is inserted into the hollow first convex shaft, and the first fixture block is clamped into an inside wall of the first shell, so that the coil is covered with the cover plate and the cover plate is installed inside the second annular groove.

9. The wireless charging power bank according to claim 8, wherein an inside edge of the cover plate is provided with a plurality of first connectors, and one side of the first connector is provided with a second fixture block; a second connecting hole is formed in the second annular groove, a first connecting hole corresponding to the second connecting hole in position is formed in the first annular groove, the first connector is inserted in the second connecting hole and the first connecting hole, and the second fixture block is clamped into the inside wall of the first shell.

10. The wireless charging power bank according to claim 6, wherein the magnet is provided with an extension end, and the extension end is provided with a convex block; and a first through hole is formed in the first annular groove, a second through hole is formed in the second annular groove and at the corresponding position of the first through hole, a neck matched with the convex block is formed in the inner side of the first shell, and after the extension end passes through the second through hole and the first through hole, the convex block is clamped into the neck so that the magnet is installed in the second annular groove.

11. The wireless charging power bank according to claim 6, wherein the wireless charging power bank also comprises a control circuit board, and the control circuit board is arranged inside the accommodating space and electrically connected with the battery.

12. The wireless charging power bank according to claim 11, wherein a first conductor hole is formed in the first annular groove, a second conductor hole is formed in the second annular groove and at the corresponding position of the first conductor hole, and the coil is electrically connected with the control circuit board through the first conductor hole and the second conductor hole.

13. The wireless charging power bank according to claim 11, wherein the control circuit board is provided with an indicator light; and a notch is formed in the position, corresponding to the indicator light, of the second shell.

14. The wireless charging power bank according to claim 11, wherein the control circuit board is also provided with a power interface.

15. The wireless charging power bank according to claim 11, wherein the second shell is provided with a power button, and the power button is electrically connected with the control circuit board.

16. The wireless charging power bank according to claim 2, wherein the inner side of the second shell is provided with a second connector, and one end of the second connector is provided with a third fixture block; a first slot is formed in the first shell, and a third connecting hole is formed in the first slot; the second connector is inserted in the first slot, and the third fixture block is clamped into the third connecting hole so that the first shell is connected with the second shell; and the third fixture block gets away from the third connecting hole so that the second connector is detached from the first slot.

17. The wireless charging power bank according to claim 3, wherein the heat dissipation shell is provided with a third connector, and a fourth connecting hole is formed in the third connector; a second slot is formed in the first shell, the second slot is internally provided with a fourth fixture block, the third connector is inserted in the second slot, and the fourth fixture block is clamped into the fourth connecting hole so that the heat dissipation shell is connected with the first shell; and the fourth fixture block gets away from the fourth connecting hole so that the third connector is detached from the second slot.

18. The wireless charging power bank according to claim 1, wherein a plurality of heat sinks are formed in the surface of the heat dissipation shell.

19. The wireless charging power bank according to claim 1, wherein the wireless charging power bank also comprises heat insulation boards, and the heat insulation boards are arranged on both sides of the battery; and the heat insulation board is made of aerogel.

20. The wireless charging power bank according to claim 8, wherein the surface of the cover plate is provided with a plurality of strip bulges.

* * * * *